United States Patent
Noethe et al.

(10) Patent No.: US 6,572,940 B1
(45) Date of Patent: Jun. 3, 2003

(54) COATINGS WITH A SILVER LAYER

(75) Inventors: Axel Noethe, Castrop-Rauxel (DE); Michael Rissmann, Haltern (DE); Thomas Paul, Herne (DE)

(73) Assignee: Flachglas Aktiengesellschaft, Fureth (DE)

( * ) Notice: Subject to any disclaimer, the term of this patent is extended or adjusted under 35 U.S.C. 154(b) by 0 days.

(21) Appl. No.: 09/446,645

(22) PCT Filed: Jun. 24, 1998

(86) PCT No.: PCT/EP98/03871

§ 371 (c)(1),
(2), (4) Date: Feb. 9, 2000

(87) PCT Pub. No.: WO99/00528

PCT Pub. Date: Jan. 7, 1999

(30) Foreign Application Priority Data

Jun. 25, 1997 (DE) .......................................... 197 26 966

(51) Int. Cl.$^7$ .......................... B32B 17/06; B32B 18/00; C03C 17/09; C03C 17/23; C23C 14/06; C23C 14/22

(52) U.S. Cl. .......................... 428/34; 428/332; 428/336; 428/426; 428/432; 428/457; 428/469; 428/472; 204/192.1; 204/192.12; 204/192.15; 204/192.26; 204/192.29

(58) Field of Search .......................... 52/786.1; 428/34, 428/332, 336, 426, 432, 457, 469, 472; 204/192.1, 192.12, 192.29, 192.15, 192.26

(56) References Cited

U.S. PATENT DOCUMENTS

| | | | |
|---|---|---|---|
| 4,462,883 A | | 7/1984 | Hart |
| 4,831,799 A | * | 5/1989 | Glover et al. ................. 52/172 |
| 4,842,703 A | * | 6/1989 | Class et al. ............. 204/192.12 |
| 4,995,895 A | | 2/1991 | Groth et al. |
| 5,110,662 A | | 5/1992 | Depauw et al. |
| 5,153,054 A | | 10/1992 | Depauw et al. |
| 5,169,509 A | | 12/1992 | Latz et al. |
| 5,336,565 A | * | 8/1994 | Muromachi et al. ........ 428/432 |
| 5,837,361 A | | 11/1998 | Glaser et al. |
| 5,962,115 A | | 10/1999 | Zmelty et al. |

FOREIGN PATENT DOCUMENTS

| | | |
|---|---|---|
| DE | 252 205 A1 | 12/1987 |
| DE | 195 48 430 C | 12/1996 |
| EP | 0 332 717 A1 | 9/1989 |
| EP | 0 464 789 A1 | 1/1992 |

OTHER PUBLICATIONS

J. Vac.Sci.Technol. A 10(4), Jul./Aug. 1992 p. 1772–1776: Reactive Alernating Current Magnetron Sputtering of Dielectric Layers; Scherer Et Al. (Leybold).

New Development in High Rate Sputtering of Dielectric Materials; G. Brauer Et Al, Leyhold AG, Germany; Proc. of the 3Rd ISSP,Tokyo 1995, pp. 63–70.

Advanced Low–Emissivity Glazings; S. Nadel, BOC Coating Technology, Fairfield, CA; 39Th Annual Technical Conference Proceedings (1996) of the Society of Vacuum Coaters, ISSN 0737–5921, pp. 157–163.

Special Features of Pulsed Magnetron Sputtering (PMS–Process) for Glass Coaters; 40Th Annual Technical Conference of the Society of Vacuum Coaters; S. Schiller Et Al., New Orleans, USA.

* cited by examiner

Primary Examiner—Stevan A. Resan
Assistant Examiner—Nikolas J Uhlir
(74) Attorney, Agent, or Firm—Marshall & Melhorn, LLC

(57) ABSTRACT

A glass sheet includes a coating comprising at least one silver layer and inner and outer antireflection layers. The glass sheet is formed by a magnetron sputtering process. The inner antireflection layer is a multiple layer comprising a layer of a titanium oxide applied by medium frequency magnetron sputtering and a layer of a metal oxide between the titanium oxide layer and a silver layer.

18 Claims, 2 Drawing Sheets

COATINGS WITH A SILVER LAYER

BACKGROUND OF THE INVENTION

1. Field of the Invention

The invention relates to a process for the production of a thin-layer system with a transparent silver layer by means of magnetron cathode sputtering, to a glass pane with transparent thin-layer system including a silver layer applied by magnetron cathode sputtering, and to a double glazing pane or unit (insulating unit) comprising such a pane.

2. Description of the Related Art

Glass panes with thin-layer systems for the purpose of influencing their transmission and reflection properties are being employed in increasing numbers for the glazing of buildings and vehicles. Here, in practice, in addition to pyrolytically applied layer systems based on semi-conductive metal oxides, primarily layer systems with at least one transparent silver layer are of significance. These layer systems typically possess the following structure: glass/lower antireflection layer/silver layer/outer antireflection layer. They are applied widely on a major industrial scale by means of magnetron cathode sputtering (U.S. Pat. No. 4,166,018).

In layer systems of this type, the silver layer serves mainly as an IR reflection layer, whilst the antireflection layers are employed specifically, through suitable selection of material and thickness, to influence the transmission and reflection properties in the visible region of the spectrum, according to application. It is generally endeavoured to provide the coated glass pane with a high light transmission factor, as well as maximum neutrality of colour in respect of transmission and external appearance.

A development of this layer system consists of employing more than one silver layer, where between the individual silver layers, additional transparent spacing layers are provided. The silver layers and the spacing layers then form a type of Fabry and Pŕot interference filter. These multiple-silver-layer systems allow the specialist further improved "fine tuning" of the optical data of glass panes coated in this way. Layer systems with two or more silver layers are employed primarily as solar control coatings, where especially high selectivity is involved. Selectivity denotes the ratio of light transmission factor to total energy transmission factor.

Thin-layer systems with only one silver layer are employed in practice primarily as large-area thermal insulation coatings which can be produced at relatively low cost, where importance is placed primarily on a high light transmission factor and a high reflection factor in the long-wave IR region, corresponding to low emissivity. From glass panes with such thin-layer systems it is possible, by combination with a normally uncoated second glass pane, to produce a thermal insulation glass which can be used primarily in the construction field, whose k value is 1.3 $W/m^2K$ or less.

As materials for the antireflection layers, in the case of common market products, primarily metal oxides such as $SnO_2$, $ZnO$ and $Bi_2O_3$ are used; these can be applied especially cost-effectively by means of magnetron cathode sputtering. Numerous other materials have already been designated for this purpose. When selecting the materials for the individual component layers of the thin-layer system, the coating specialist must take account of a considerable number of conditions. Thus, for the properties of the thin-layer system, not only the refractive indices of the individual component layers and their thickness play a significant part in selective regulation of the optical properties in respect of interference. The component layers also possess different properties in respect of refractive index, crystalline structure, crystallite size, roughness, porosity, surface energy, etc., according to the process with which they are applied and which component layer had been applied beforehand. As is known, the properties of thin layers, which frequently consist of only a few atomic layers, are determined very pronouncedly by the conditions of epitaxy and on their boundary areas.

In the past, the specialist world has devoted special attention to improving the properties of silver layers. Silver layers are sensitive to a whole series of chemical and physical influences during the production of thin-layer systems, then during further processing and transportation of the coated glass panes, and finally during their use for the intended purpose. It is already known practice to protect the silver layer from the corrosive coating atmosphere during application of the outer antireflection layer of a Low-E thin-layer system by reactive cathode sputtering through application of thin metal or metal oxide layers (EP 0 104 870, EP 0 120 408). It is also known practice to protect silver layers from the influence of oxygen during heat treatment, for example during bending or tempering of glass panes by applying special auxiliary layers of greater thickness than that of the above-mentioned protective layers to the silver layer, which inhibit the diffusion of oxygen to the silver layer (EP 0 233 003). Both the first-mentioned protective layers and the last-mentioned auxiliary layers are preferably designed such that they are oxidised to the maximum extent in the finished product, so that they reduce the light transmission factor as little as possible and, as transparent dielectric layers, become component parts of the outer antireflection layers on the silver layers.

It is also known that the corrosion resistance of the silver layer can be improved by suitable selection of the materials for the lower antireflection layer. DE 39 41 027 A1, from which the invention is derived as generic state-of-the-art, teaches in this connection that the lower antireflection layer be configured as a sandwich coating, where the component layer contiguous to the silver layer will have an zinc oxide layer with a maximum thickness of 15 nm. The lower antireflection layer should according to this publication possess at least one further component layer, for which tin oxide, titanium oxide, aluminium oxide and bismuth oxide are named. Preferred, and dealt with exclusively in the embodiments, is a layer structure, where the lower antireflection layer possesses three component layers, that is to say, a first 2–14 nm thick layer of titanium oxide, a second 15–25 nm thick layer of tin oxide, and as third, the zinc oxide layer mentioned, with a maximum thickness of 15 nm. Onto the contiguous silver layer is applied, according to this publication, an outer antireflection layer, which consists of a metal layer of specially selected metals, permitting bending or tempering while being oxidized during the course of heat treatment, as well as of one or more additional metal oxide layer(s).

A similar structure is shown by EP 0 773 197, where the teaching is to be taken from this publication that to achieve a high level of light transmission and reduced emissivity, the zinc oxide layer contiguous to the silver layer is to be applied with a minimum thickness of 16 nm. As materials for at least one further layer of the lower antireflection layer, metal oxides, such as bismuth oxide, tin oxide or silicon nitride, are named. Both publications teach the application of the single layers required by means of conventional magnetron cathode sputtering, where metal targets are sputtered by application of a DC voltage (DC cathode sputtering).

SUMMARY OF THE INVENTION

The inventors have thoroughly investigated these and other previously known thin-layer systems and have found that they may be further improved in respect of the properties attainable. They have concerned themselves particularly with the problem that the transparent silver layers according to the state-of-the-art possess specific conductivity which is far below that which should be achievable for a defect-free silver layer of corresponding uniform thickness. This reduction in specific conductivity is especially apparent in the case of relatively thin silver layers. Thus, it was observed that in the case of thin-layer systems produced and constructed according to the state-of-the-art, measurable electrical conductivity only occurred at silver layer thicknesses of 4 nm or more, conductivity increasing with increasing layer thickness, but still remaining below the theoretically attainable value. For silver layers in the thickness range of 10–15 nm of especial interest for thermal insulation and solar control applications, it was possible at best to achieve specific conductivity values of approximately $2 \cdot 10^5$ S/cm with the known and conventionally produced layer structures. In order to obtain a specified electrical surface resistance or specified emissivity, the specialist had to employ significantly thicker silver layers than theoretically necessary. This led to problems in regulating the colour in external appearance and reduced the light transmission factor of the thin-layer system in an undesirable fashion. Of course, the state-of-the-art is acquainted with processes for subsequent improvement in the conductivity of silver layers, for example by means of heat treatment or irradiation (DE 42 39 355, DE 43 23 654, DE 44 12 318, EP 0 585 166). The use of these processes however increases the production costs for such products significantly and should if possible be avoided.

The invention is based on the technical problem of improving the known thin-layer systems with at least one silver layer and their manufacture such that such silver layer possesses especially high specific conductivity and/or low emissivity.

We have found that this may be achieved by sputtering the silver layer over a layer of titanium oxide deposited by medium frequency sputtering.

According to one aspect of the present invention, there is provided a process for the production of a thin-layer system with a transparent silver layer by means of magnetron cathode sputtering, where between the substrate and the silver layer is arranged a multiple lower antireflection layer, which comprises a titanium oxide layer applied directly onto the substrate, as well as a zinc oxide layer contiguous to the silver layer, characterized by the fact that the 15–50 nm thick titanium oxide layer is applied by means of medium-frequency sputtering from two titanium cathodes in an oxygen-containing atmosphere onto the substrate and that the 2–18 nm thick zinc oxide layer is applied directly onto the titanium oxide layer.

According to a further aspect of the invention, there is provided a glass pane with a transparent thin-layer system applied by means of magnetron cathode sputtering, the system consisting of a multiple lower antireflection layer, which comprises a titanium oxide layer directly on the glass pane, as well as a zinc oxide layer contiguous to the silver layer, a transparent silver layer, optionally at least one pair of layers consisting of a spacing layer and a further transparent silver layer, as well as an outer antireflection layer, characterized by the fact that the titanium oxide layer is a titanium oxide layer with a thickness of 15–50 nm applied by means of medium-frequency sputtering from two titanium cathodes in an oxygen-containing atmosphere, that the titanium oxide layer is directly contiguous to a zinc oxide layer with a thickness of 2–18 nm, and that the silver layer contiguous to the lower antireflection layer possesses a thickness of 7–20 nm.

The invention further provides a process for coating glass with a coating comprising at least one silver layer and inner and outer antireflection layers by magnetron sputtering characterized in that the inner antireflection layer comprises a layer of titanium oxide applied by medium frequency sputtering.

Using the present invention, it is possible to achieve a specific conductivity of at least $2.1 \times 10^5$ S/cm, and, in general, silver layers having a high electrical conductivity and hence low emissivity may be deposited. The invention further makes possible, as described hereafter, the deposition of as far as possible colour-neutral thin-layer systems for double-glazing panes with, in the case of thermal insulation applications, a high light transmission factor at specified emissivity or in the case of solar control applications with especially high selectivity, preferably a selectivity value of 2 or more. By appropriate use of the invention, such properties may be achieved without the use of subsequent heat treatment processes or other costly and time-consuming processes for aftertreatment of the thin-layer system Surprisingly, it is possible to provide silver layers with extremely high specific conductivity by using on the one hand, with the series of layers glass/titanium oxide/zinc oxide, a special twin lower antireflection layer and on the other hand the first of these component layers being produced by the use of the medium-frequency sputtering process. The specialist who was acquainted with the above-mentioned state-of-the-art could not expect that in fact this series of layers leads to such outstanding results in respect of the silver layer properties.

As trials of the inventors showed, it is possible to achieve the most favourable values for specific conductivity of the silver layer with a multiple lower anti-reflection comprising a titanium oxide layer and a zinc oxide layer. Less favourable values are achieved with single lower antireflection layers of for example titanium oxide, tin oxide, zinc oxide or bismuth oxide, or other twin-layer structures. The use according to the invention of the medium-frequency sputtering process for production of the first component layer of titanium oxide leads to a further significant improvement in the silver-layer quality over conventionally applied titanium oxide layers. This is all the more surprising in that, in the case of the preferred layer structure according to the invention, between the titanium oxide layer and the silver layer thus applied, there is also a zinc oxide layer up to 18 nm thick, so that such a clear effect on the silver layer quality of the production technique for the first layer of titanium oxide applied to the glass pane could not be expected. It is surprising not only that the nature of the sputtering process used to deposit the titanium oxide has such an effect on the subsequently deposited silver layer, but that it does so even when an intervening metal oxide layer is used, and indeed the use of a zinc oxide layer over the titanium oxide layer leads to even better silver layer properties than operating with the titanium oxide layer deposited by the medium frequency sputtering process alone.

The medium-frequency sputtering process is described for example in DD 252 205 and J.Vac.Sci.Technol. A 10(4), July/August 1992. It may be operated using a pair of magnetron cathodes with targets arranged in front, which generally both consist of the same material to be sputtered, the polarity of the cathodes changing periodically at a frequency in the kilohertz range. Within the scope of the invention, it is preferable to operate at a frequency of approximately 5–100 kHz, in particular 10–40 kHz. The medium-frequency sputtering process permits reactive application of the titanium oxide layer from two titanium targets at high coating rate, the use of this process evidently leading to a special microscopic structure and/or surface characteristic of the titanium oxide layer, which also finally affects the properties of the silver layer in the manner striven for.

A zinc oxide layer over the titanium oxide layer is also produced preferably by medium-frequency sputtering, although it does however lie within the scope of this aspect of the invention to produce the zinc oxide layer by means of conventional DC cathode sputtering.

Particularly favourable silver layer properties can be achieved by, instead of a pure titanium oxide layer, a nitrogenous titanium oxide layer (sometime also called titanium oxide nitride layer), with a nitrogen content N/(N+ O) in the layer of 5–50 atomic percent being applied in an coating atmosphere containing argon, nitrogen and oxygen. It is preferable to proceed such that the nitrogenous titanium oxide layer is applied in an atmosphere containing argon and nitrogen in the quantitative proportion of 3:1 to 1:5, as well as oxygen. The addition of nitrogen to the coating atmosphere during application of the titanium oxide layer permits not only operation at an increased coating rate, but also improves the quality of the subsequently applied silver layer. The nitrogen content of the coating atmosphere is preferably limited upwards such that the nitrogenous titanium oxide layer produced not yet possesses any significant absorption in the visible region of the spectrum, as can be observed in the case of pure titanium nitride layers. The oxygen content of the coating atmosphere is adjusted such that adequate oxygen is available for oxidation of the titanium and that the coating rate is as high as possible.

Where, in connection with the invention, in order to simplify the terminology titanium oxide layers are mentioned, regularly nitrogenous titanium oxide layers will be included, unless pure titanium oxide layers are expressly referred to.

The process for application of the titanium oxide layer should be conducted such that a coating rate of at least 30 nm/min, preferably over 50 nm/min is reached. By coating rate is meant the epitaxial rate on the glass substrate. The level of the coating rate clearly has an effect on the microscopic properties of the titanium oxide layer, higher coating rates for the titanium oxide tending to lead to improved properties of the silver layer.

Especially preferred glass panes according to the invention are distinguished by the fact that the first layer of the lower antireflection layer is a preferably nitrogenous titanium oxide layer with a thickness of 15–50 nm, applied to the glass pane by the use of the medium-frequency sputtering process, that directly contiguous to the titanium oxide layer is a zinc oxide layer with a thickness of 2–18 nm, and that the silver layer possesses a thickness of 7–20 nm. The thickness of the titanium oxide layer is preferably between 18 and 40 nm, the thickness of the zinc oxide layer is preferably between 4 and 12 nm, and the thickness of the silver layer is preferably between 8 and 15 nm. It has been found advantageous for provision of the complete thin-layer system if the outer antireflection layer consists of a 2–5 nm thick protective layer of an oxide of one of the metals In, Sn, Cr, Ni, Zn, Ta, Nb, Zr, Hf, in particular of In(90)Sn(10)- oxide, as well as of an outer layer of a material selected from the oxides of Sn, Zn, Ti, Nb, Zr and/or Hf and silicon nitride, in particular of $SnO_2$ with an optical thickness of 60–120 nm, preferably 80–100 nm. It can be preferable, especially for solar control layer systems if, between the silver layer contiguous to the lower antireflection layer and the outer antireflection layer, at least one pair of layers is provided, consisting of a spacing layer and a further silver layer. With such layer systems, it is possible by optimizing the layer thicknesses of the individual layers, to achieve combinations not previously considered possible of the values for light transmission factor, emissivity and neutrality of external appearance.

Of course, application of the invention is not restricted to the use of inorganic glass panes, in particular float glass panes. By glass panes within the scope of the invention are meant all transparent panes of inorganic or organic vitreous material. It lies within the scope of the invention to add to the individual layers of the thin-layer system small quantities of other materials in order to improve their chemical or physical properties, as long as no significant decrease in the specific conductivity of the silver layer is caused thereby. In particular, it lies within the scope of the invention to use, instead of pure metal oxides, nitrogenous metal oxide layers for the oxide component layers used.

The invention includes double-glazing panes with a glass pane coated according to the invention, especially thermal insulation double-glazing panes which, with a glass thickness of 4 mm of the two single glass panes, an argon gas filling, an interspace of 16 mm, as well as in the case of arrangement of the thin-layer system on the surface of the interior glass pane facing the interspace, a light transmission factor of at least 76%, a k value of maximum 1.1 $W/m^2K$, an emissivity of maximum 0.04, and as colour coordinates of external appearance values of a* between –2 and +1, and b* of between –6 and –2.

BRIEF DESCRIPTION OF THE DRAWINGS

The invention is explained in detail below with the aid of Figures and examples. These show the following.

DESCRIPTION OF THE PREFERRED EMBODIMENTS

Figure 1:
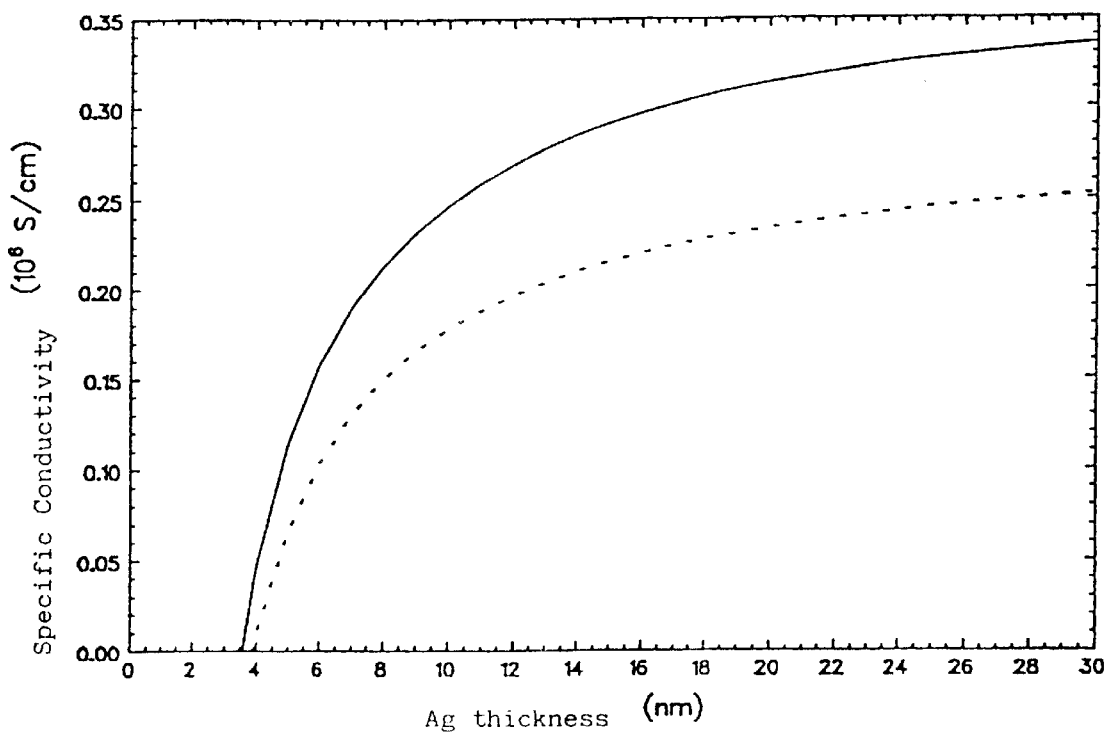
FIG. 1 a graphical representation of the characteristic of the specific conductivity of a layer system of titanium oxide, zinc oxide and silver as a function of the thickness of the silver layer, FIG. 2 a graphical representation of the characteristic of the electrical resistance of a layer system in accordance with FIG. 1 with constant silver layer thickness as a function of the thickness of the zinc oxide layer, FIG. 3 a graphical representation of the characteristic of reflection and transmission factor between 400 and 2500 nm for a glass pane with a thermal insulation layer system according to the invention, FIG. 4 a graphical representation in accordance with FIG. 3 for a glass pane with a solar control layer system according to the invention.

FIG. 1 reproduces the characteristic of specific conductivity of a silver layer for various layer thicknesses for arrangement of the silver layer on two differently produced lower antireflection layers. The continuous curve shows the characteristic of specific conductivity for the lower antireflection layer consisting of a titanium oxide layer produced according to the invention which has been applied to the glass pane by means of the medium-frequency sputtering process, as well as of a layer of zinc oxide contiguous to the silver layer and to the titanium oxide layer. Even from a thickness of approximately 3.5 nm, measurable conductivity is evident. For thicker silver layers, the value of specific conductivity approaches a limit value of approximately $3.5 \cdot 10^5$ S/cm.

The broken line FIG. 1 reproduces the characteristic of specific conductivity for a comparative example where the titanium oxide layer has been produced by means of the conventional technology of DC cathode sputtering. In this case, a measurable conductivity only commences from a layer thickness of more than 4.0 nm. For thicker silver layers, a limit value of only $2.5 \cdot 10^5$ S/cm is obtained, that is to say one third below the value which is achieved according to the invention.

The cause of this surprisingly high specific conductivity of the silver layer produced according to the invention presumably lies in the especially favourable epitaxy conditions for the silver which have been created by the lower antireflection layer produced according to the invention. The trials of the inventor indicate that best results may be achieved by appropriate selection of the materials for the two component layers of the lower antireflection layer, as well as the special production process for the titanium oxide layer. In the case of the medium-frequency sputtering process using double-cathodes, the rate of coating for titanium oxide can be significantly higher that with the conventional DC cathode sputtering. Presumably, as a result of the increased rate of coating and altered coating conditions associated with the use of this special sputtering process, the layer structure of the titanium oxide layer, and thus indirectly the silver layer, is influenced in the desired manner.

Figure 2:
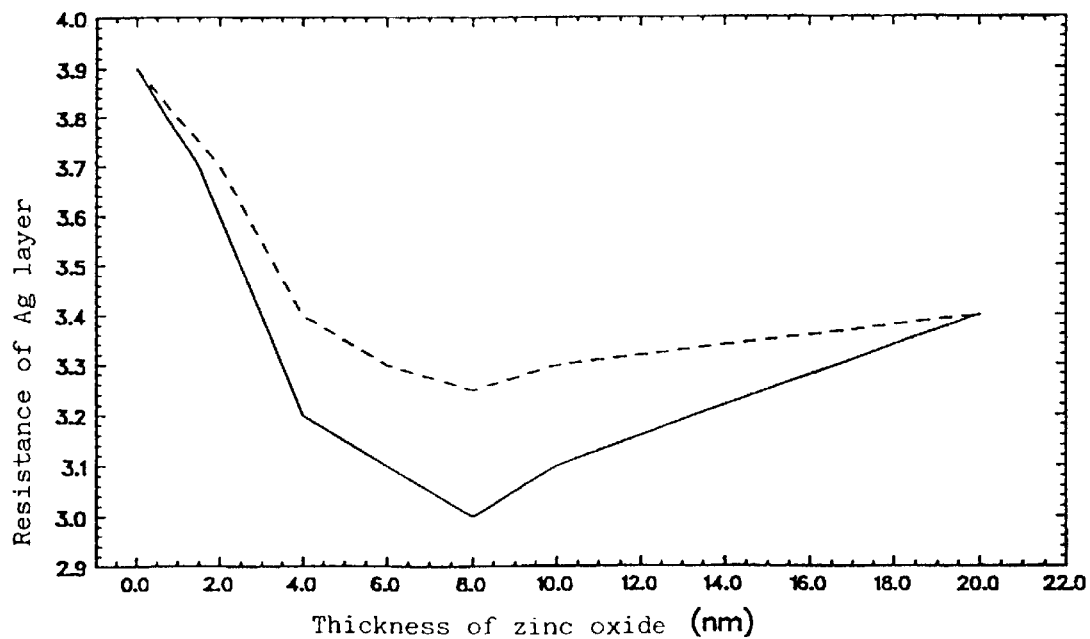

The fact that not only the process of production of the titanium oxide layer according to the invention is important if the highest quality silver layers are to be produced, is illustrated by FIG. 2. This Figure reproduces the characteristic of electrical resistance (in arbitrary units) of a silver layer with a thickness of 12.5 nm deposited on a lower antireflection layer consisting of a 25 nm thick titanium oxide layer and a zinc oxide layer. The representation of this Figure is based on a series of trials, where the thickness of the silver layer and the thickness of the titanium oxide layer have each been kept constant whilst the thickness of the zinc oxide layer has been varied. The continuous curve reproduces the values of electrical resistance for a lower antireflection layer with a titanium oxide layer which had been created by the medium-frequency sputtering process. The broken line shows the values for a titanium oxide layer which had been produced by the conventional DC cathode sputtering process. It can be seen first of all that the values for the titanium oxide layer produced according to the invention are clearly, that is to say by up to 10%, below those for a titanium oxide layer applied conventionally. In addition, it becomes clear that for the electrical resistance, a distinct minimum is obtained with a thickness of the zinc oxide layer of approximately 8 nm in the case of the layer according to the invention, the resistance being between approximately 2 nm and 18 nm below the values attainable with conventional technology.

The production process according to the invention and the coated glass panes producible with it are illustrated below with the aid of examples.

EXAMPLE 1

Onto a 4 mm thick float glass pane of soda lime silicate glass with the dimensions 40×40 cm$^2$, a 25 nm thick titanium oxide layer was applied initially in a vacuum chamber with a medium-frequency double-cathode arrangement. For this purpose, an Ar/N$_2$/O$_2$ mixture in a volume ratio of 12:8:3 was introduced into the chamber, so that a pressure of $2.2 \cdot 10^{-3}$ mbar was obtained. The output of the double-cathode was 8.4 kW, the alternating frequency of the voltage was 25 kHz. Onto the titanium oxide layer was subsequently applied with the aid of a DC cathode an 8 nm thick zinc oxide layer. For this purpose, an Ar/O$_2$ gas mixture was introduced into the chamber, so that a pressure of $2.4 \cdot 10^{-3}$ mbar was obtained. The output of the cathode was 4.1 kW. Finally, a 12.5 nm thick silver layer was applied. For this purpose, argon was introduced into the chamber, so that a pressure of $1.4 \cdot 10^{-3}$ mbar was obtained. The output of the cathode was 1.4 kW.

The glass pane coated thus had on the coated side a surface resistance of 2.9Ω and an IR reflection factor of 97% at 8 µm. The specific conductivity of the silver layer was $2.75 \cdot 10^5$ S/cm.

COMPARATIVE EXAMPLE 2

Onto a glass pane according to Example 1, a 25 nm thick titanium oxide layer was applied initially with a medium-frequency double-cathode in a vacuum chamber. For this purpose, an Ar/O$_2$ gas mixture was introduced into the chamber, so that a pressure of $2.1 \cdot 10^{-3}$ mbar was obtained. The output of the cathode was 8.8 kW, the alternating frequency of the voltage was 25 kHz. Onto the titanium oxide layer—at variance from Example 1—a silver layer was applied directly. For this purpose, argon was introduced into the chamber, so that a pressure of $1.4 \cdot 10^{-3}$ mbar was obtained. The output of the cathode was 1.4 kW. The thickness of the silver layer was, as in the first Example, 12.5 nm.

The glass pane coated thus had on the coated side a surface resistance of 3.9Ω and an IR reflection factor of 96.2% at 8 µm. The specific conductivity of the silver layer was $2.0 \cdot 10^5$ S/cm, and was thus nearly 30% below that of the layer produced according to the invention according to Example 1.

COMPARATIVE EXAMPLE 3

Onto a glass pane according to Example 1, a 20 nm thick zinc oxide layer was applied initially, directly, in a vacuum chamber. For this purpose, an Ar/O$_2$ mixture was introduced into the chamber, so that a pressure of $2.4 \cdot 10^{-3}$ mbar was obtained. The output of the cathode was 4.1 kW. Onto the zinc oxide layer was directly applied a 13.0 nm thick silver layer. For this purpose, argon was introduced into the chamber, so that a pressure of $1.4 \cdot 10^{-3}$ mbar was obtained. The output of the cathode was 1.4 kW.

The glass pane coated thus had on the coated side a surface resistance of 3.6Ω and an IR reflection factor of 96.6% at 8 µm. The specific conductivity of the silver layer was $2.1 \cdot 10^5$ S/cm, and was thus nearly one quarter below that of the layer according to Example 1 produced according to the invention.

COMPARATIVE EXAMPLE 4

Onto a glass pane according to Example 1, a 25 nm thick titanium oxide layer was applied by means of a conventional DC cathode. For this purpose, an Ar/N$_2$/O$_2$ gas mixture in the proportions of 3:10:2 was introduced into the chamber, so that a pressure of $5.0 \cdot 10^{-3}$ mbar was obtained. The output of the cathode was 10.0 kW. Onto the titanium oxide layer was subsequently applied an 8 nm thick zinc oxide layer. For this purpose, an $Ar/O_2$ gas mixture was introduced into the chamber, so that a pressure of $6.8 \cdot 10^{-3}$ mbar was obtained. The output of the cathode was 8.3 kW. Finally, a 12.6 nm thick silver layer was applied. For this purpose, argon was introduced into the chamber, so that a pressure of $1.4 \cdot 10^{-3}$ mbar was obtained. The output of the cathode was 1.8 kW.

The glass pane coated thus had on the coated side a surface resistance of $3.8\Omega$ and an IR reflection factor of 96% at 8 $\mu$m. The specific conductivity of the silver layer was $2.1 \cdot 10^5$ S/cm, and was thus nearly one quarter below that of the silver layer according to the first Example.

Examples 1–4 show that by using the antireflection layer constructed and produced according to the invention, it was possible to achieve a surface resistance of the silver layer of less than $3\Omega$ with a layer thickness of approximately 12.5–13 nn. The specific conductivity) of the silver layer was in all three Comparative Examples clearly below that of the layer produced according to the invention. This means, on account of the known relationships between electrical conductivity of the silver layer and its emissivity or IR reflection factor, that with a silver layer of specified thickness and thus upwardly limited light transmission, it is possible with the invention to achieve an especially high IR reflection factor and thus an especially low emissivity.

The advantageous effects of the invention for practical applications become especially clear in connection with the description of the following two examples of production of glass panes with complete thin-layer systems. These possess, in addition to the basic structure according to Example 1, at least one outer antireflection layer, as well as optionally at least one further silver layer, separated from the first by means of a spacing layer. The data for emissivity and for the k value are based on the calculation methods of ISO Standard 10292. For determination of the light transmission factor and the total energy transmission factor, reference was made to ISO Standard 9050, whilst the coordinates a* and b* were determined according to DIN 6174.

EXAMPLE 5

In order to obtain a thermal insulation coating with high reflectance in the long-wave IR region suitable for the production of a high-efficiency, highly light-transmitting thermal insulation double-glazing pane, a magnetron cathode sputtering system was used initially to apply onto a 4 mm thick glass pane with the dimensions 40×40 cm$^2$, a 22.9 nm thick titanium oxide layer with the aid of a medium-frequency double-cathode. For this purpose, an $Ar/N_2/O_2$ gas mixture in the proportion of 6:20:3 was introduced into the chamber, so that a pressure of $2.6 \cdot 10^{-3}$ mbar was obtained. The cathode output was 8.4 kW, the alternating frequency of the voltage was 25 kHz. The rate of coating for the titanium oxide layer was 50 nm/in. Subsequently, a 5 nm thick zinc oxide layer was applied onto the titanium oxide layer by means of a DC cathode. For this purpose, an $Ar/O_2$ gas mixture was introduced into the chamber, so that a pressure of $2.4 \cdot 10^{-3}$ mbar was obtained. The output of the cathode was 4.1 kW. Subsequently, an 11.8 nm thick silver layer was applied. For this purpose, the argon was introduced into the chamber, so that a pressure of $1.4 \cdot 10^{-3}$ mbar was obtained. The output of the cathode was 1.4 kW. Onto the silver layer was first applied a 3 nm thick In(90)Sn(10) layer as protective layer for the subsequent reactive application of the outer antireflection layer. For this purpose, an $Ar/O_2$ gas mixture was introduced into the chamber, so that a pressure of $2.4 \cdot 10^{-3}$ was obtained. The output of the cathode was 0.7 kW. As principal layer of the outer antireflection layer, a 44.8 nm thick tin oxide layer was finally applied. For this purpose, an $Ar/O_2$ gas mixture was introduced into the chamber, so that a pressure of $4.4 \cdot 10^{-3}$ mbar was obtained. The output of the cathode was 4.7 kW.

The glass pane coated thus had as single pane a light transmission factor of 84.8%. The emissivity on the coated side was 0.04. The coated glass pane was with the coated side facing the interspace assembled with a second 4 mm thick uncoated float glass pane to form a thermal insulation double-glazing pane with an interspace distance of 16 mm and an argon gas filling. In the case of the arrangement of the coated glass pane on the inside (thin-layer system at Position 3), the double-glazing pane had a light transmission factor of 76.3% and a k value of 1.1 W/m$^2$K. The spectrum locus of external reflection was defined by the colour coordinates a*=−0.1 and b*=−4.4. The external appearance of the thermal insulation double-glazing pane was thus almost neutral in colour.

Figure 3:
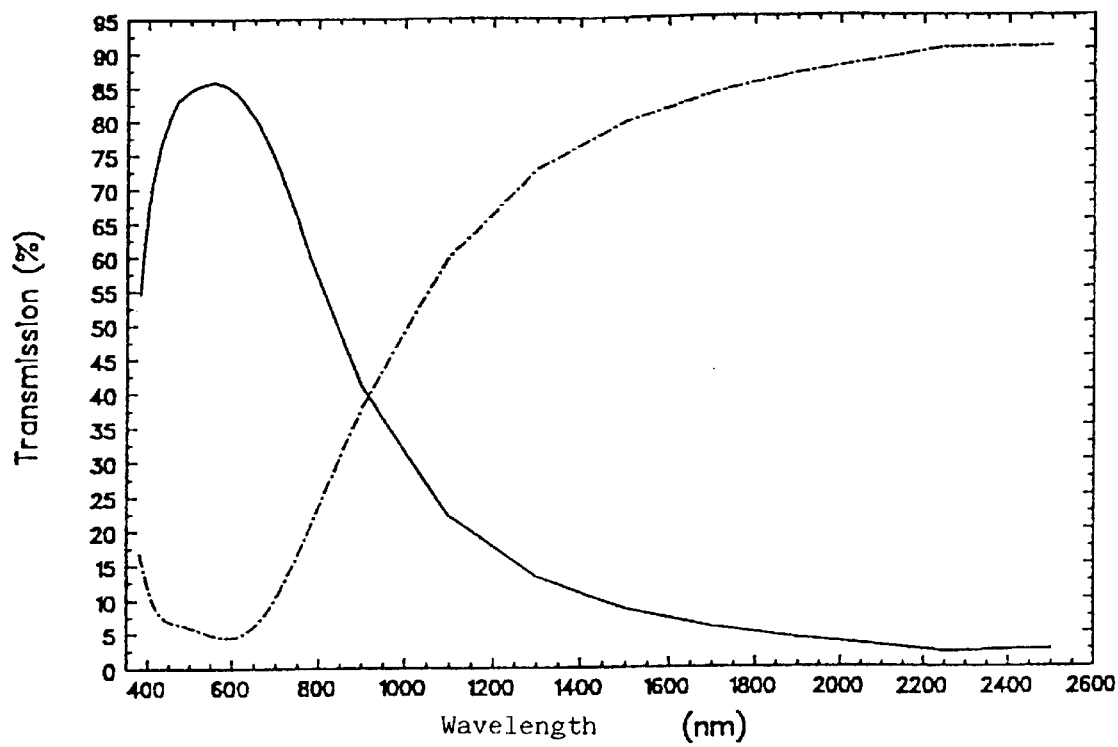

The spectral characteristic of the transmission factor of the coated single glass pane in the spectral range and in the near IR region is shown in FIG. 3 as a continuous curve. The characteristic of the reflection factor of the coating on the coated side is reproduced in broken line.

EXAMPLE 6

In order to obtain a protective coating suitable for production of a solar control double-glazing pane with high selectivity (ratio of light transmission factor to total energy transmission factor), a magnetron cathode sputtering system was used first of all to deposit on a 6 mm thick float glass pane with the dimensions 40×40 cm$^2$, 31.8 nm thick titanium oxide layer with the aid of a medium-frequency double-cathode. For this purpose, an $Ar/N_2/O_2$ gas mixture in the proportions of 12:8:3 was introduced into the chamber, so that a pressure of $2.2 \cdot 10^{-3}$ mbar was obtained. The output of the cathode was 8.4 kW, the frequency of the voltage being 25 kHz. Subsequently, a 5 nm thick zinc oxide layer was applied. For this. purpose, an $Ar/O_2$ mixture was introduced into the chamber, so that a pressure of $2.4 \cdot 10^{-3}$ was obtained. The output of the cathode was 4.1 kW. There followed an 11 nm thick first silver layer. For this purpose, argon was introduced into the chamber, so that a pressure of $1.4 \cdot 10^{-3}$ mbar was obtained. The output of the cathode was 1.4 kW. Onto the first silver layer was applied a 3 nm thick In(90)Sn(10) layer as protective layer. For this purpose, an $Ar/O_2$ gas mixture was introduced into the chamber, so that a pressure of $2.4 \cdot 10^{-3}$ was obtained. The output of the cathode was 0.7 kW. Then, an 84.9 nm thick tin oxide layer serving as spacing layer for the subsequent second silver layer was applied. For this purpose, an $Ar/O_2$ gas mixture was introduced into the chamber, so that a pressure of $4.4 \cdot 10^{-3}$ was obtained. The output of the cathode was 4.7 kW. Onto this SnO$_2$ spacing layer was applied a second 14 nm thick silver layer. For this purpose, argon was introduced into the chamber, so that a pressure of $1.4 \cdot 10^{-3}$ was obtained. The output of the cathode was 1.4 kW. Onto the second silver layer was applied, as onto the first silver layer, and with the same process parameters, a 3 nm thick In(90)Sn(10) oxide layer. Finally, as principal layer of the outer antireflection layer, a 37.8 nm thick tin oxide layer was applied. For this purpose, an $Ar/O_2$ gas mixture was introduced into the chamber, so that a pressure $4.4 \cdot 10^{-3}$ mbar was obtained. The output of the cathode was 4.7 kW.

The glass pane coated thus had as single pane a light transmission factor of 79.6%. It was assembled with another, uncoated float glass pane of thickness 6 mm to form a solar control double-glazing pane with an interspace distance of 16 mm and an argon gas filling. With arrangement of the thin-layer system on the inside of the outer pane (Position 2), a light transmission factor of 71.0% and a total energy transmission factor (g value) of 35.2% were obtained. Thus, an unusually high selectivity value of 2.02 was obtained for this solar control double-glazing pane. The external appearance, with the reflection colour coordinates of a*=−0.3 and b*=−1.15, was extremely colour neutral.

Figure 4:
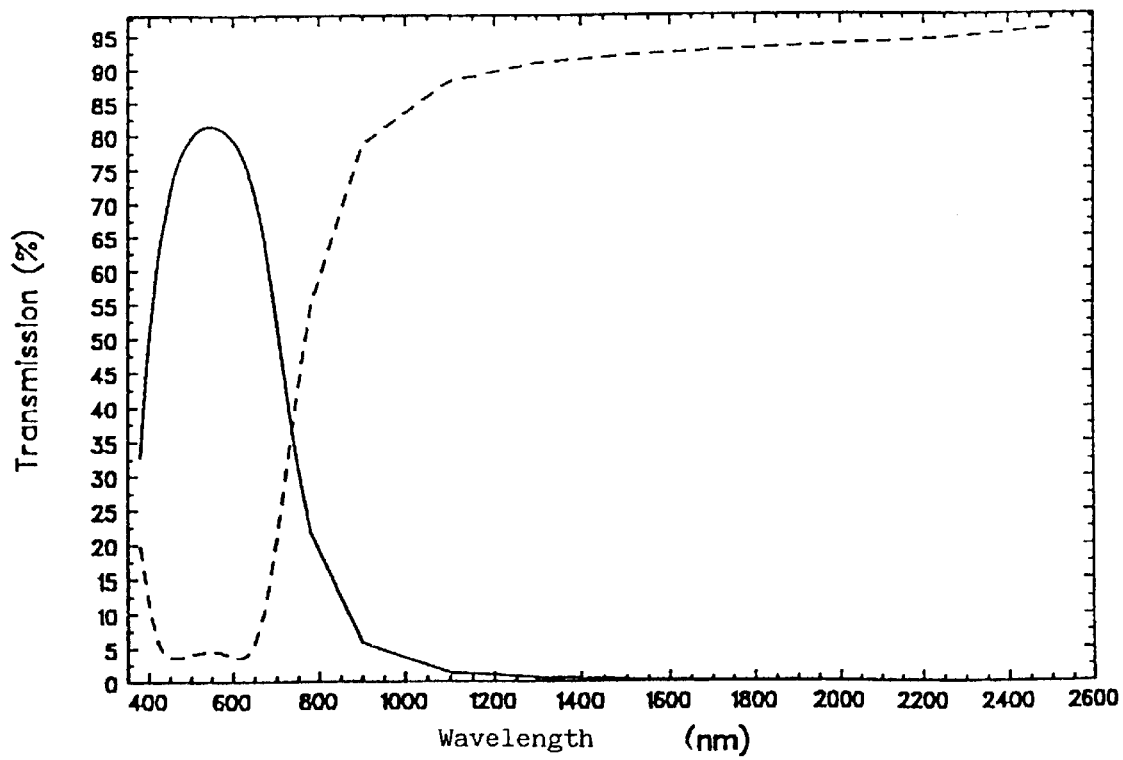

The spectral characteristic of the transmission factor of the coated single glass pane in the visible spectral range and in the near IR region is represented in FIG. 4 as a continuous curve. The characteristic of the reflection factor in respect of the coated side is represented in broken line.

The use of the invention is not restricted to constructions of Examples 5 and 6. These serve rather as examples of what properties of end products can be achieved by applying the teaching of the invention.

What is claimed is:

1. Glass pane with a transparent thin-layer system applied thereon, the system consisting of a multiple lower antireflection layer, which comprises a titanium oxide layer directly on the glass pane, as well as a zinc oxide layer contiguous to a transparent silver layer, optionally at least one pair of layers consisting of a spacing layer and a further transparent silver layer, as well as an outer antireflection layer wherein the titanium oxide layer has a thickness of 15–50 nm applied by means of magnetron sputtering at a frequency of 5–100 KHz from two titanium cathodes in an oxygen-containing atmosphere, and that the titanium oxide layer is directly contiguous to a zinc oxide layer with a thickness of 2–18 nm.

2. Glass pane according to claim 1, wherein the titanium oxide layer contains nitrogen with a content of nitrogen N/(N+O) in the layer of 5 to 50 atomic percent.

3. Glass pane according to claim 1, wherein the titanium oxide layer possesses a thickness of 18–40 nm.

4. Glass pane in accordance with claim 1, wherein the zinc oxide layer possesses a thickness of 4–12 nm.

5. Glass pane according to claim 1, wherein the silver layer present in the lower antireflective layer possesses a thickness of 8 to 15 nm.

6. Glass plane according to claim 1, wherein the outer antireflection layer consists of a 2–5 nm protective layer and an outer layer having an optical thickness between 60–120 nm, wherein the protective layer is formed on the silver layer present in the lower antireflective layer opposite the side of the zinc oxide layer, wherein the protective layer is selected from at least one of the group consisting of the oxides of In, Sn, Cr, Ni, Zn, Ta, Nb, Zr, Hf, and the outer layer is formed from at least one of the group consisting of the oxides of Sn, Zn, Ti, Nb, Zr, Hf and silicon nitride.

7. Glass pane according to claim 1, wherein at least one pair of layers, consisting of a spacing layer and a further silver layer, is provided between the silver layer contiguous to the lower antireflection layer and the outer antireflection layer.

8. Glass pane according to claim 1, wherein the silver layer contiguous to the lower antireflection layer possesses a thickness of 7–20 nm and a specific conductivity of at least $2.1 \times 10^5$ S/cm.

9. Double glazing pane incorporating a coated glass pane according to claim 1.

10. A double-glazing pane according to claim 9, comprising two parallel single glass panes separated by a distance of 16 mm, with argon gas between the panes wherein at least one of the panes has the thin-layer system arranged on the surface of the pane which faces the other pane, and the double glazing pane exhibits alight transsmission factor ≦76% as measured according to ISO standard 9050, a k value ≧1.1 W/m²K and emissivity ≦0.04 as calculated according to ISO standard 10292, wherein the double glazing pane has color coordinates according to DIN 6174 of a* between −2 and +1 and of b* between −6 and −2.

11. Double glazing pane according to claim 10, wherein the glass panes each have a thickness of 4 mm.

12. Process for coating glass with a coating comprising at least one silver layer and inner and outer antireflection layers, wherein the inner antireflection layer is a multiple layer comprising a layer of a titanium oxide on the substrate, said titanium oxide layer formed by magnetron sputtering at a frequency between 5–100 KHz in an oxygen containing atmosphere, a layer of a zinc oxide formed on the titanium oxide layer and a silver layer formed on the zinc oxide layer.

13. Process according to claim 12, wherein the titanium oxide layer is applied to a thickness between 15–50 nm via magnetron sputtering at a frequency between 5–100 KHz from two titanium cathodes and the zinc oxide layer has a thickness between 2–18 nm and is formed directly onto the titanium oxide layer.

14. Process according to claim 12, wherein the titanium oxide layer is applied at a coating rate of at least 30 nm/min.

15. Process according to claim 12, wherein the titanium oxide layer is applied at a coating rate of more than 50 nm/min.

16. Process according to claim 12, wherein the zinc oxide layer is applied by magnetron sputtering at a frequency between 5–100 KHz from two zinc targets in an oxygen-containing atmosphere.

17. Process according to claim 12, wherein the titanium oxide layer is applied as a nitrogenous titanium oxide layer with a nitrogen content N/(N+O) in the layer of 5 to 50 atomic percent in a coating atmosphere containing argon, nitrogen and oxygen.

18. Process according to claim 17, wherein the nitrogenous titanium oxide layer is applied in a coating atmosphere containing oxygen, argon and nitrogen wherein the quantitative ratio of argon to nitrogen (Ar:N) is 3:1 to 1:5.

* * * * *